United States Patent
Jallamion-Grive et al.

(10) Patent No.: US 7,386,769 B2
(45) Date of Patent: Jun. 10, 2008

(54) ON CHIP DIAGNOSIS BLOCK WITH MIXED REDUNDANCY

(75) Inventors: Yannis Jallamion-Grive, Mougins (FR); Michel Collura, Villeneuve-Loubet (FR); Jean-Christophe Vial, Antibes (FR)

(73) Assignee: Infineon Technologies AG, Munich (DE)

( * ) Notice: Subject to any disclaimer, the term of this patent is extended or adjusted under 35 U.S.C. 154(b) by 275 days.

(21) Appl. No.: 10/942,274

(22) Filed: Sep. 16, 2004

(65) Prior Publication Data
US 2005/0091563 A1    Apr. 28, 2005

(30) Foreign Application Priority Data
Sep. 16, 2003    (EP) .................................. 03292283

(51) Int. Cl.
*G11C 29/00*    (2006.01)
(52) U.S. Cl. ...................... 714/710; 714/718; 714/722; 365/201
(58) Field of Classification Search ................ 714/710, 714/711; 365/200–201
See application file for complete search history.

(56) References Cited

U.S. PATENT DOCUMENTS

| | | | | |
|---|---|---|---|---|
| 4,460,999 A | * | 7/1984 | Schmidt ...................... 714/711 |
| 4,751,656 A | * | 6/1988 | Conti et al. .................... 716/1 |
| 5,410,687 A | * | 4/1995 | Fujisaki et al. ............ 365/201 |
| 5,469,390 A | | 11/1995 | Sasaki et al. |
| 5,859,804 A | * | 1/1999 | Hedberg et al. ............ 365/201 |
| 5,910,921 A | | 6/1999 | Beffa et al. |
| 6,032,264 A | * | 2/2000 | Beffa et al. ..................... 714/7 |
| 6,065,134 A | | 5/2000 | Bair et al. |
| 6,141,267 A | | 10/2000 | Kirihata et al. |
| 6,172,916 B1 | * | 1/2001 | Ooishi ................... 365/189.02 |
| 6,304,989 B1 | | 10/2001 | Kraus et al. |
| 6,502,216 B1 | | 12/2002 | Takano |
| 6,711,705 B1 | * | 3/2004 | Yasui ......................... 714/723 |
| 6,928,377 B2 | * | 8/2005 | Eustis et al. ................. 702/118 |
| 7,003,704 B2 | * | 2/2006 | Adams et al. .............. 714/711 |
| 7,188,274 B2 | * | 3/2007 | Nadeau-Dostie et al. ...... 714/6 |
| 2002/0108073 A1 | * | 8/2002 | Hughes ......................... 714/7 |

OTHER PUBLICATIONS

Best Solution Generator for Redundancy, IBM Technical Disclosure Bulletin, IBM Corp., vol. 29, No. 6, Nov. 1, 1986, pp. 2756-2758.
Akira Tanabe et al., "A 30-ns 64 Mb DRAM with Built-in Self-Test and Self-Repair Function", IEEE Journal of Solid-State Circuits, vol. 27, No. 11, pp. 1-7, Nov. 27, 1992, New York, US.

* cited by examiner

*Primary Examiner*—Jacques Louis-Jacques
(74) *Attorney, Agent, or Firm*—Patterson & Sheridan, L.L.P.

(57) ABSTRACT

On chip diagnosis method and on chip diagnosis block with mixed redundancy (IO redundancy and word-register redundancy) is provided. During a BIST (Built-In Self Test), information needed to apply redundancy resources is stored inside two arrays (fill_array, shift_array) on chip. A final diagnosis may apply redundancy resources based on this stored information. The first array (fill_array) is used to keep a minimum error mapping and the second array (shift_array) is used to control the fill of the first array.

27 Claims, 17 Drawing Sheets

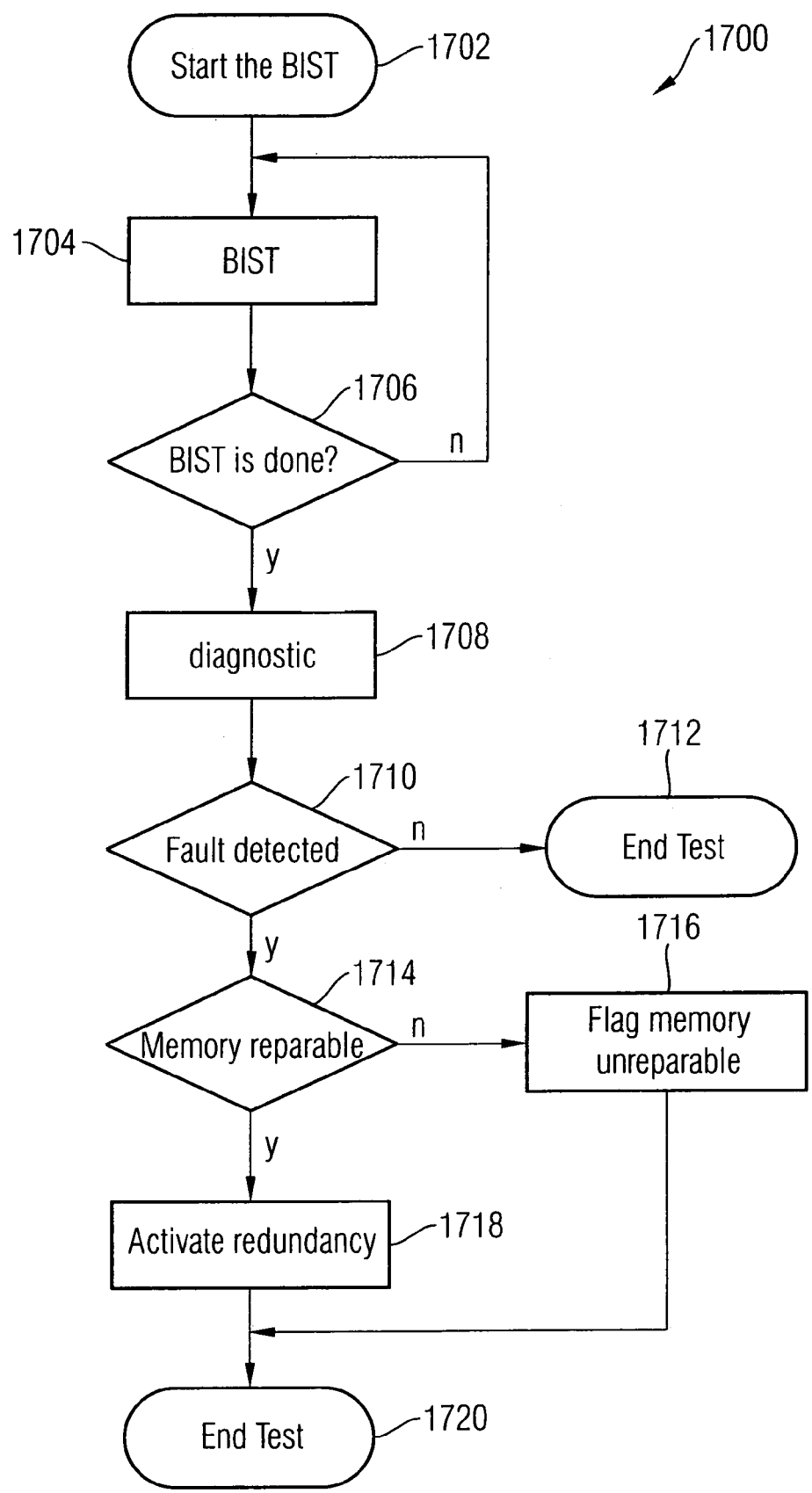

ON CHIP DIAGNOSIS BLOCK WITH MIXED REDUNDANCY

CROSS-REFERENCE TO RELATED APPLICATIONS

This application claims foreign priority benefits under 35 U.S.C. §119 to co-pending European patent application number 03 292 283.3, filed Sep. 16, 2003. This related patent application is herein incorporated by reference in its entirety.

BACKGROUND OF THE INVENTION

1. Field of the Invention

The invention relates to diagnosis and repair of defects of memories on chips. In particular, the invention relates to an on-chip diagnosis method and to an on-chip diagnosis block.

2. Description of the Related Art

Memories are much denser than logic circuits. Since many bits need to be packed as tightly as possible, defects are part of any fabrication process. In order to compensate for these defects and increase the yield, most memories have some type of redundancy: internal redundancy (e.g., input/output-IO or WordLine-WL redundancy) or external redundancy (e.g., utilizing external word-registers). Most fails on memories are single cell fails, non-single cell type defects (IO) or clusters of fails. If one wishes to maximize an increase in yield, then one has to mix the different types of available redundancies (internal and external).

Several solutions to fix defects inside memories with redundancy are utilized according to the state of the art. For example, external redundancy utilizes registers to replace failing words. This type of redundancy is well suited for single bit or small cluster fails. However, this type of redundancy is not well suited for bit-line (BL) or IO oriented failures. Internal redundancy (utilizing WordLine and/or IO line replacement) is well suited for clusters of fails and non-single cell types defects (e.g., IO or WordLine defects). The main disadvantage of internal redundancy is that this solution increases the access and cycle time in the memory block because one has to compare the actual address with information stored in fuses.

Hybrid approaches, for example, that utilize a combination of word, wordline, and bitline redundancy are also possible. Advantages to one such approach are described in the commonly-assigned (with the present application) European patent application EP 03002698.3, entitled "Memory Built-In Self Repair (MBISR) circuits/devices and method for repairing a memory comprising a Memory Built-In Self Repair (MBISR) structure". The main disadvantages of such hybrid approaches are that more than one BIST (Built-In Self Test) runs are needed (e.g., at least three), the usage of redundant wordline implies a loss in performances, the repair solution is hard-coded (first IO/BL, the WordLine, and finally Words), in some cases memories that could be repaired will be discarded and the additional logic needed may be relatively expensive, in particular because a lot of comparisons are performed.

Accordingly, a need exists for an on chip diagnosis logical block and method for memory repair

SUMMARY OF THE INVENTION

It is an object of the present invention to provide an on chip diagnosis block for memory repair and an on chip diagnosis method for memory repair, which on chip diagnosis block and which on chip diagnosis method are able to overcome and least part of the disadvantages from the state of the art.

An idea realised in the present invention allows to improve the yield with a mix of two types of redundancy: external (word-register) and internal redundancy (redundant IO only).

The memories are tested in two steps. A first step stores (during the BIST run) inside two arrays (one to keep the minimum error mapping and the other one to control the fill of the first one) the main information necessary for a final diagnosis (to apply all redundancy resources needed). A second step performs the final diagnosis (based upon the analysis of said two arrays).

The size of the two arrays used is mainly dependent on the size of the redundancy (number of internal redundant IO and external word-register).

The core of the present invention is the way to store (on chip) the defects during the BIST in these two arrays and the way to perform (on chip) the diagnosis based on information stored in these two arrays.

The invention provides the following advantages. It finds a good compromise to repair several types of defects and hence to increase yield. Diagnosis is done "On Chip", i.e. there is no need to do an external analysis. Therefore less time is needed for testing the chip. Diagnostic of an optimal repair solution is very fast. The number of additional gates needed to analyse errors is very small compared to method known from the state of the art. There is no impact on timings compared to a memory with internal redundant IO and WordLine. Only one BIST run is needed. Both IO and word-registers repair solutions are evaluated in the same run. All fixable memories will be repaired, i.e. there is no possibility that fixable memories will be discarded. The diagnosis may be performed independently from the architecture of the memory, the BIST algorithm, and the type of memory (e.g., static random access memory-SRAM, dynamic random access memory-DRAM, or content addressable memory-CAM).

Once all failures are detected in a memory, the present invention allows to do easily a fast diagnosis in order to propose the best repair solution even if there are several types of defects (single, IO, cluster).

BRIEF DESCRIPTION OF THE DRAWINGS

Examples of preferred and advantageous embodiments of the invention will now be described herein below with reference to the accompanying drawings in which:

FIG. 17 is a flow chart of a test repair sequence.

DETAILED DESCRIPTION OF THE PREFERRED EMBODIMENT

Figure 1:
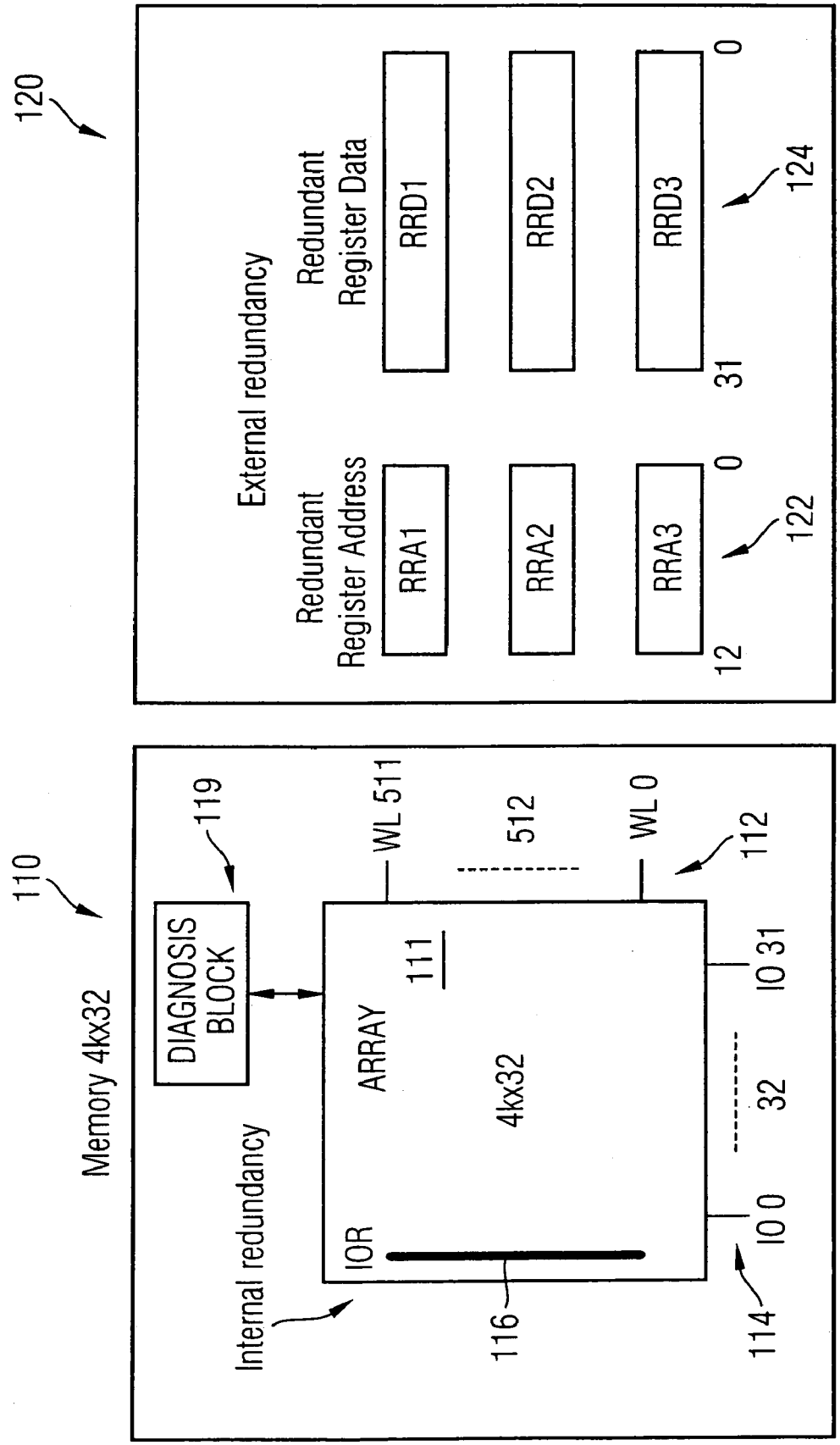
FIG. 1 is a schematic view of an embodiment of the invention with respect to an SRAM (illustratively, 4k×32)

An embodiment of the invention will now be described with respect to an SRAM 4kx32 with 1 redundant IO and 3 redundant registers. Such an SRAM 110 embodying an on chip diagnosis block according to the invention is shown in FIG. 1. As illustrated, the SRAM 110 comprises an array 111 of storage elements accessible via wordlines (WLs) 112 and IO lines 114. As can be seen, the word-register redundancy is carried out as external redundancy 120 (illustratively, having 3 redundant data registers 124 for addresses stored in corresponding redundant address registers 122, and internal redundancy is the redundant IO only (IOR 116). Summarizing, the available redundancy of the embodiment shown in FIG. 1 consists of one complete redundant IO (IOR 116) inside the memory, and three external redundant register addresses 122. As illustrated, the SRAM 110 includes an on-chip diagnosis block 119 configured to perform diagnosis operations described herein.

Figure 2:
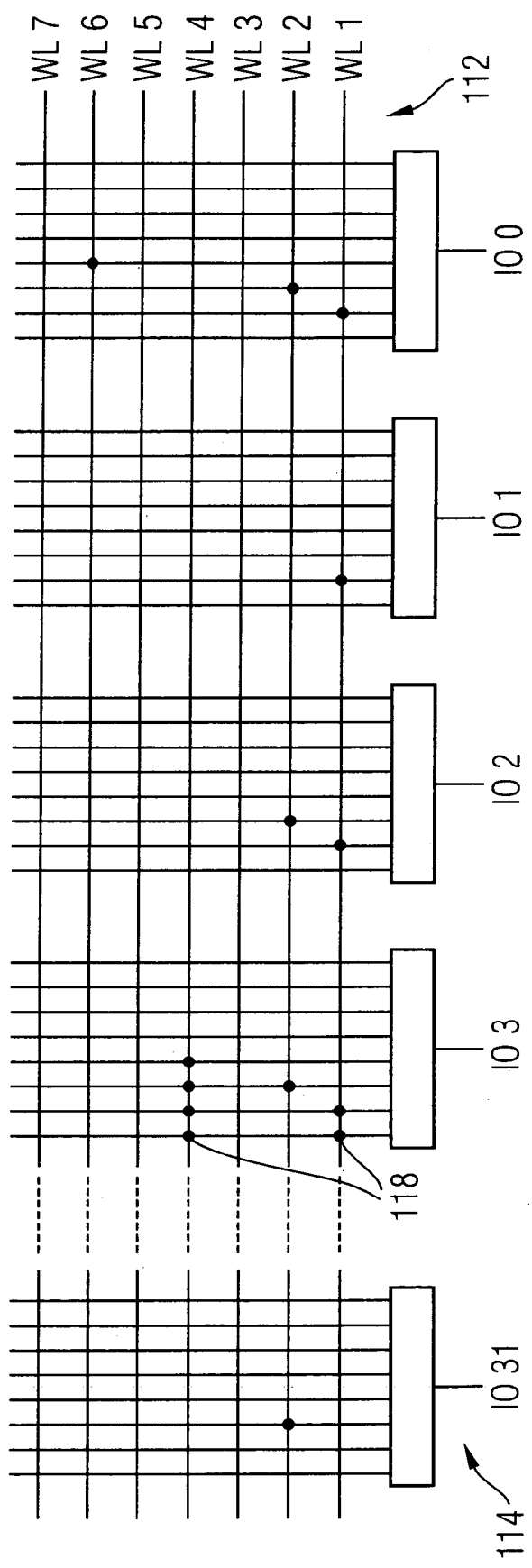
FIG. 2 shows an example of a failure with respect to the SRAM of FIG. 1.

FIG. 2 shows an example of a failure in the SRAM of FIG. 1, which failure is repairable with the available redundancy. Detected failures are indicated in the figures as dots 118 in the array 111.

During a BIST run all these errors 118 are produced. It has to be noted that some errors are produced several times, depending on the state of the BIST. Single error or multiple errors on the same word are possible.

Figure 3:
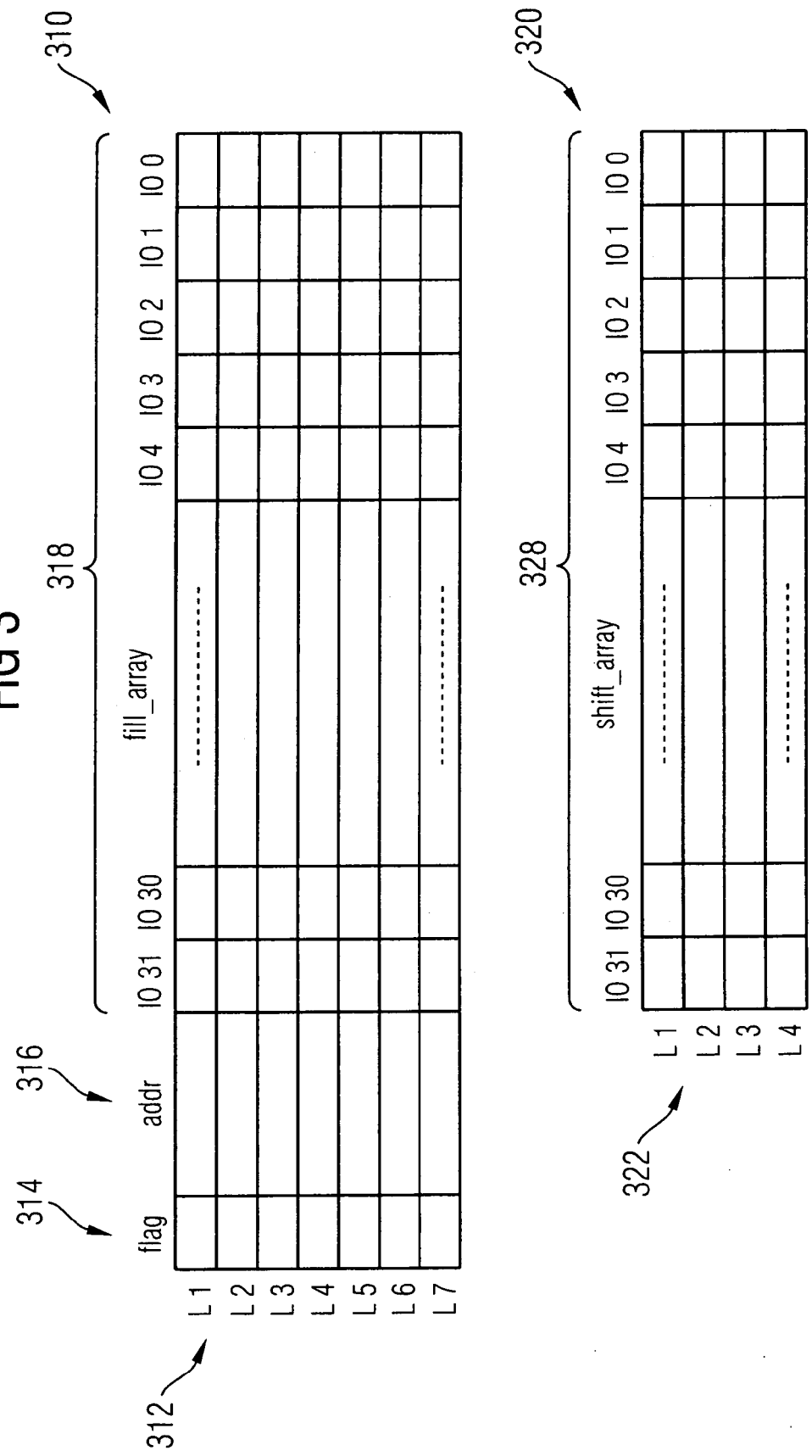
FIG. 3 shows an example of a fill_array and of a shift_array, respectively.

The on chip diagnosis block 119 according to the invention comprises two mandatory arrays ("fill_array" 310 and "shift_array" 320), examples of which are shown in FIG. 3. As illustrated, the fill_array 310 may include multiple lines 312, each including a flag column 314, address column 316, and a column 318 for each IO line 114.

The size of the fill_array 310 is defined by the total size of available redundancy. In the present example, there are 1 redundant IO and 3 redundant word registers. In this example, the number of lines 312 is defined by:

2*(3 redundant registers)+1 redundant IO=7 lines

As illustrated, the shift_array 320 may include multiple lines 322, each including a column 328 for each IO line 114. The size of the shift_array 320 depends on the number of redundant registers. In this example, the number of lines 312 is defined by:

3 redundant registers+1=4 lines

With respect to the SRAM 110 of FIG. 1 comprising the failure shown in FIG. 2, the FIGS. 4 to 13 show in a detailed view how to fill the two mandatory arrays (fill_array 310 and shift_array 320) for diagnosis according to one embodiment of an on chip diagnosis method according to the invention.

Figure 4:
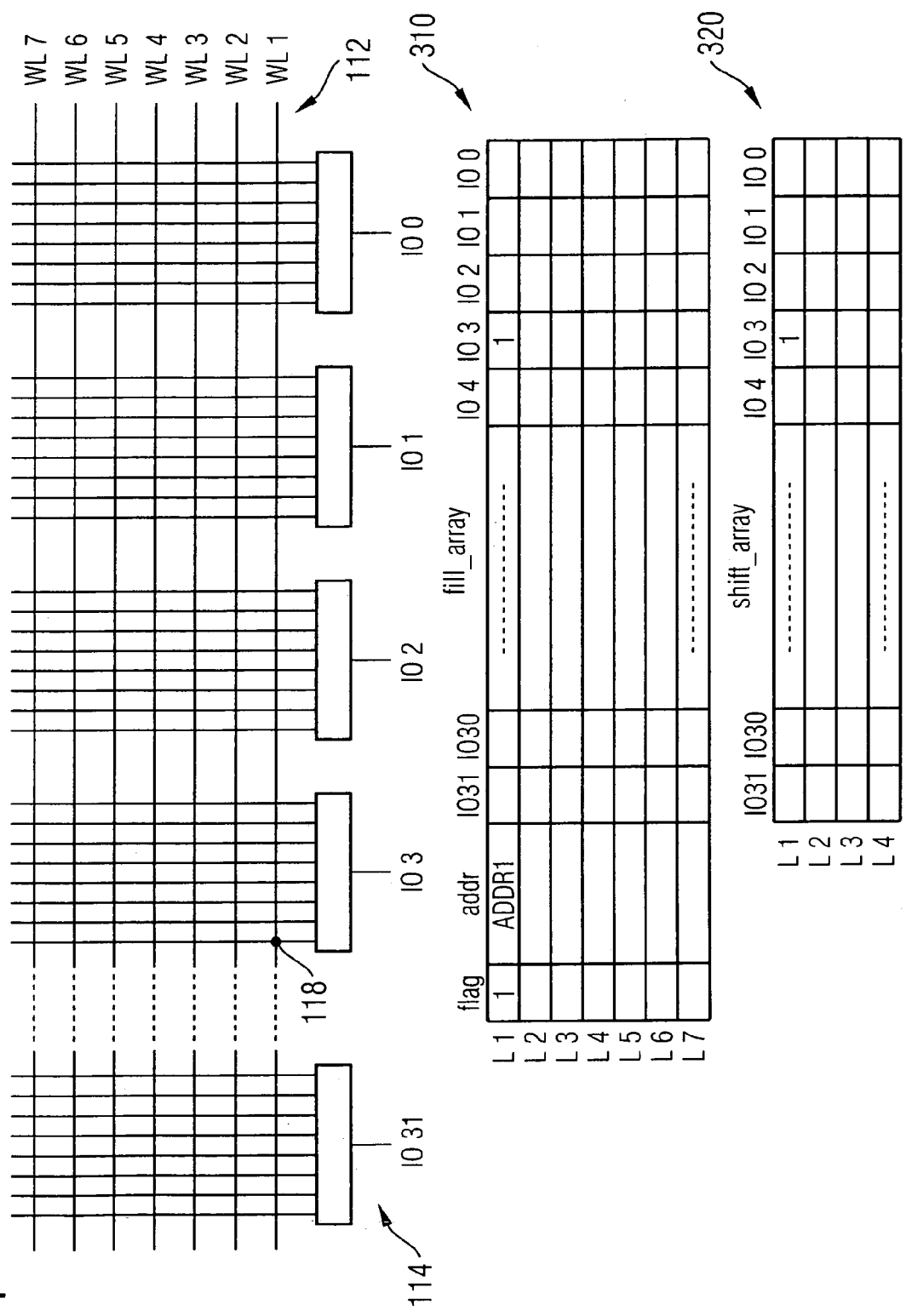
FIGS. 4 to 13 show in a detailed view how, according to one embodiment of the method according to the invention, to fill the arrays of FIG. 3 during diagnosis of the failure shown in FIG. 2.

As illustrated in FIG. 4, a first defect on IO line 3 may be detected at a first address. In response, a flag bit for the first line in the fill_array 310 may be set, and the first address may be stored in the address column. A bit may also be set in the column corresponding to IO line 3, indicating the location of the detected defect. In the first line of the shift_array 320, a bit may be set in the column corresponding to IO line 3.

Figure 5:
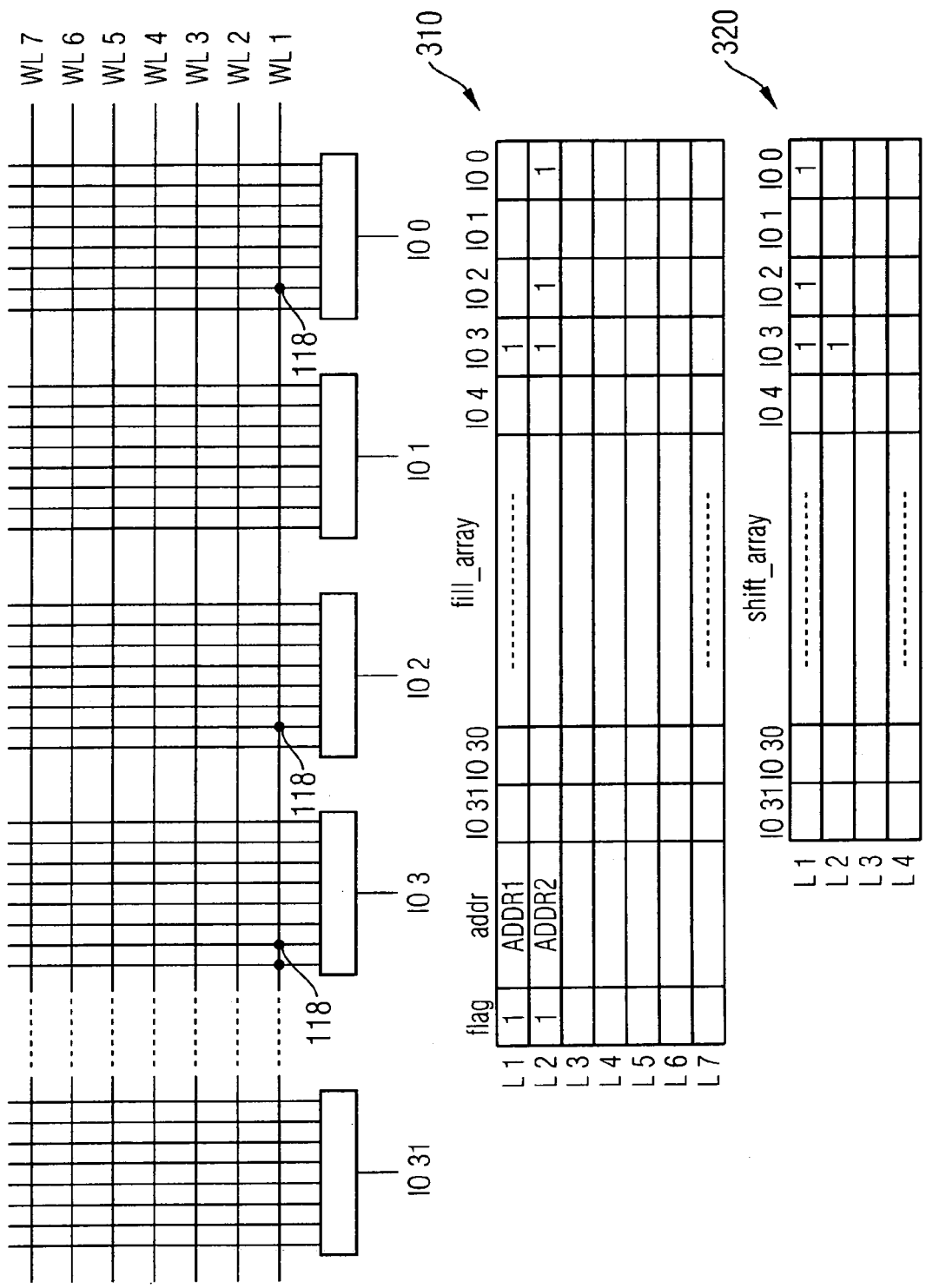

As illustrated in FIG. 5, a second set of 3 defects on IO lines 3, 2, and 0 may be detected at a second address. In response, a flag bit for the second line in the fill_array 310 may be set, and the second address may be stored in the address column. Bits may also be set in the column corresponding to IO lines 3, 2, and 0 indicating the location of the detected defects. In the shift_array 320, the first line may be shifted down to the second line and bits in the first line may be set in the columns corresponding to IO line 3, 2, and 0.

Figure 6:
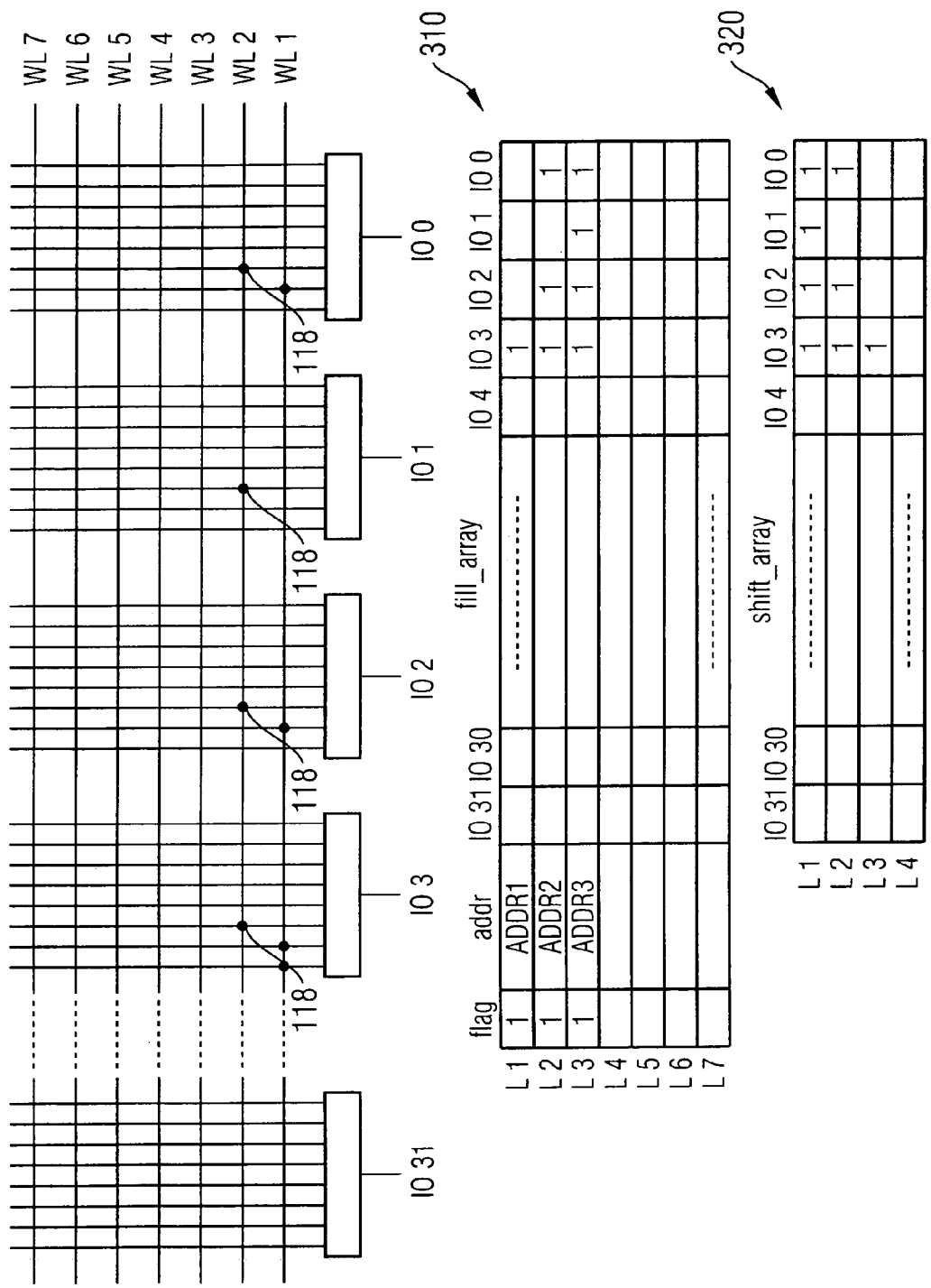

As illustrated in FIG. 6, a third set of 4 defects on IO lines 3, 2, 1, and 0 may be detected at a third address. In response, a flag bit for the third line in the fill_array 310 may be set, and the third address may be stored in the address column. Bits may also be set in the column corresponding to IO lines 3, 2, 1, and 0 indicating the location of the detected defects. In the shift_array 320, the first and second lines may be shifted down, and bits in the first line may be set in the columns corresponding to IO line 3, 2, 1, and 0.

Figure 7:
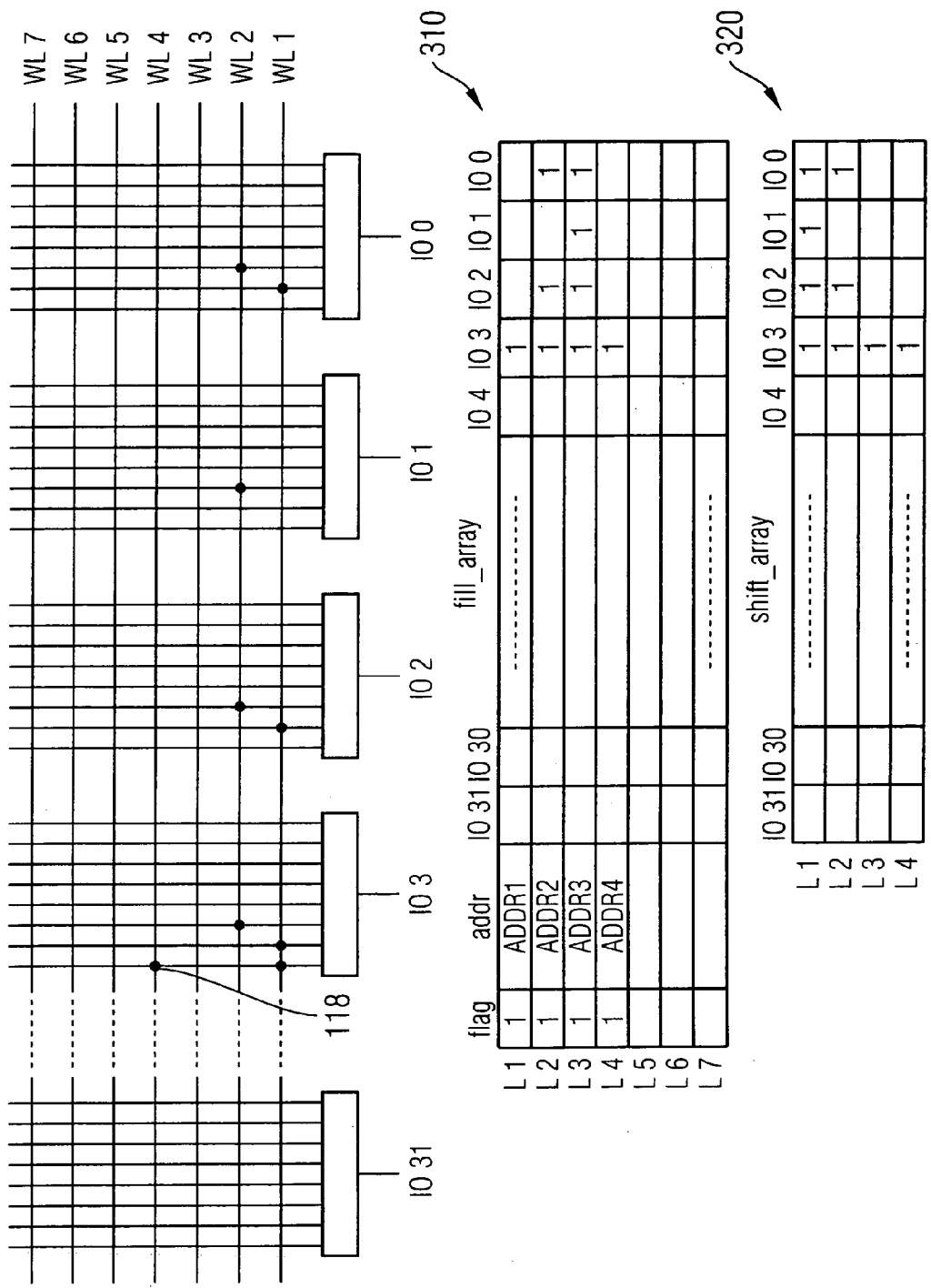

As illustrated in FIG. 7, a fourth defect on IO line 3 may be detected at a fourth address. In response, a flag bit for the fourth line in the fill_array 310 may be set, and the fourth address may be stored in the address column. A bit may also be set in the column corresponding to IO line 3, indicating the location of the detected defect. In the shift_array 320, the first, second, and third lines may be shifted down, and a bit in the first line may be set in the column corresponding to IO line 3, 2, 1, and 0.

Figure 8:
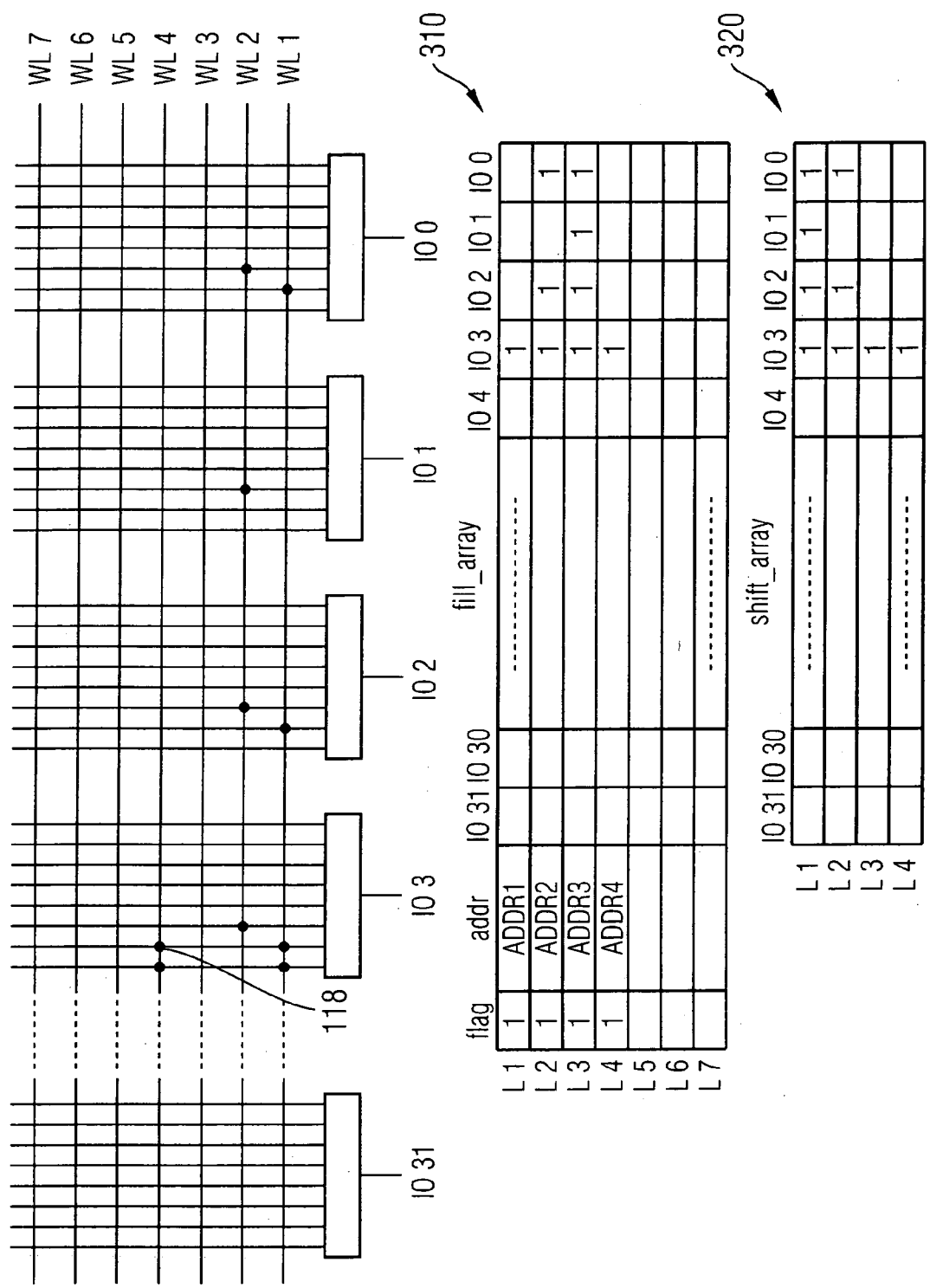
Figure 9:
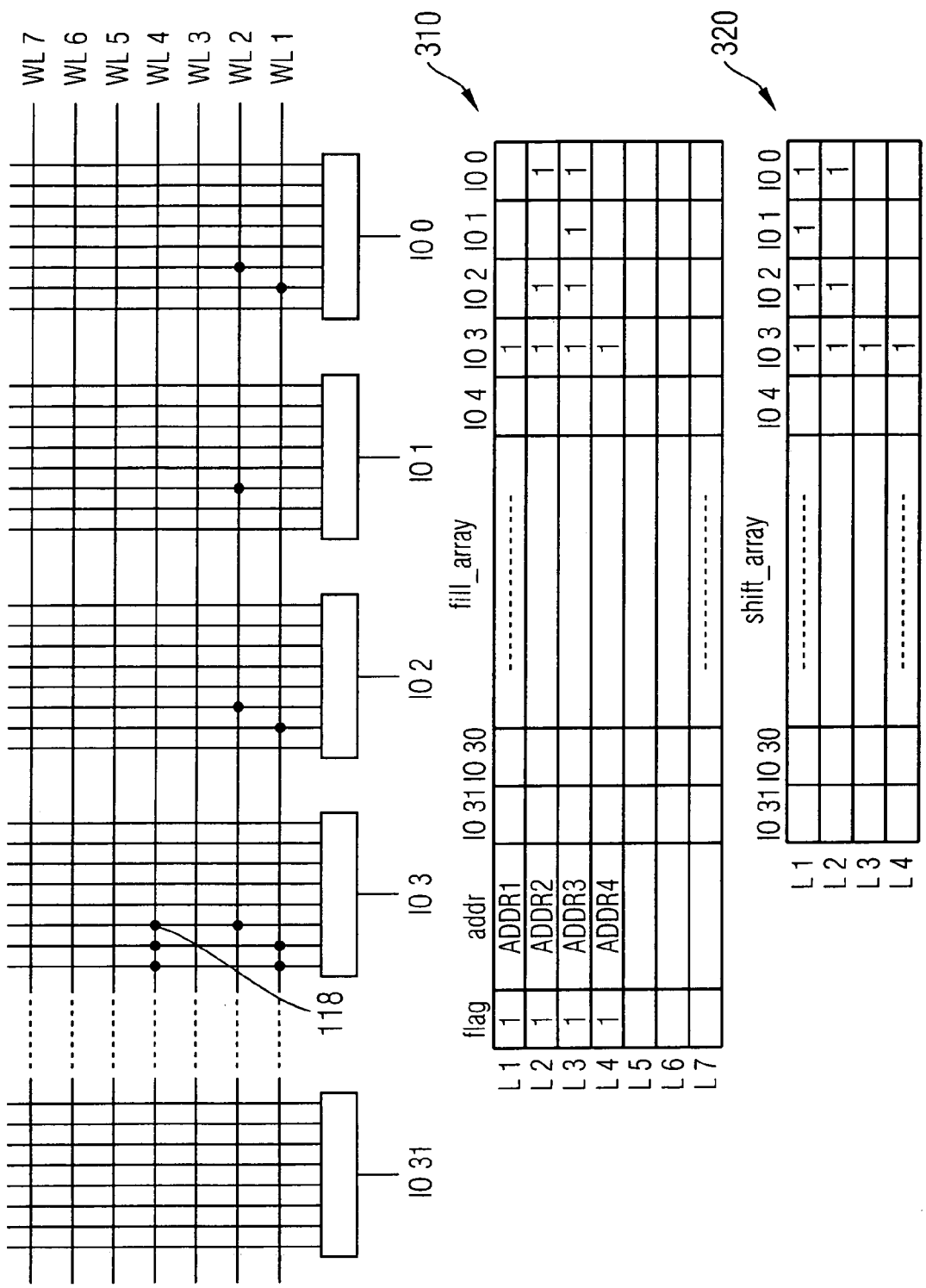
Figure 10:
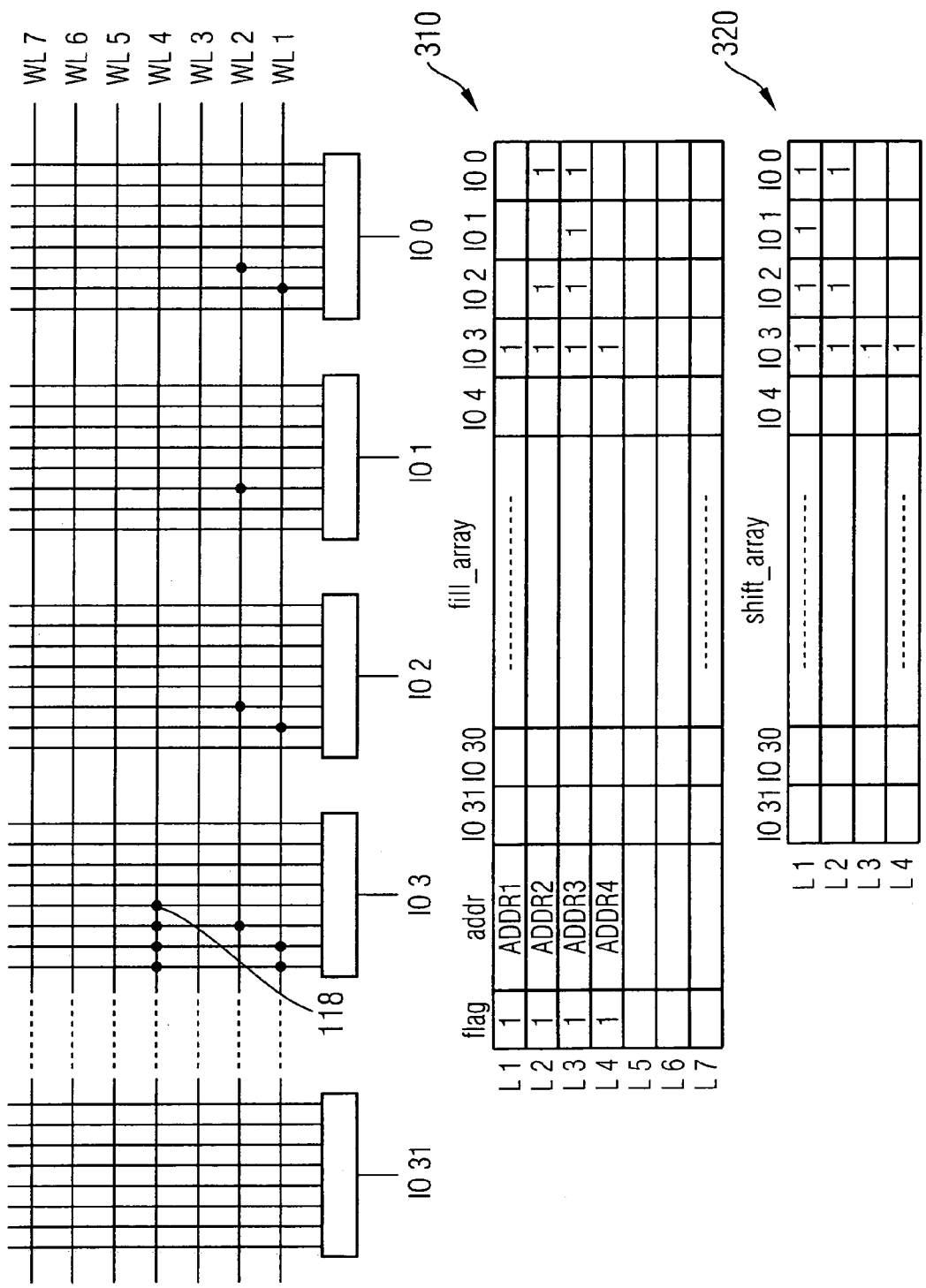
Figure 12:
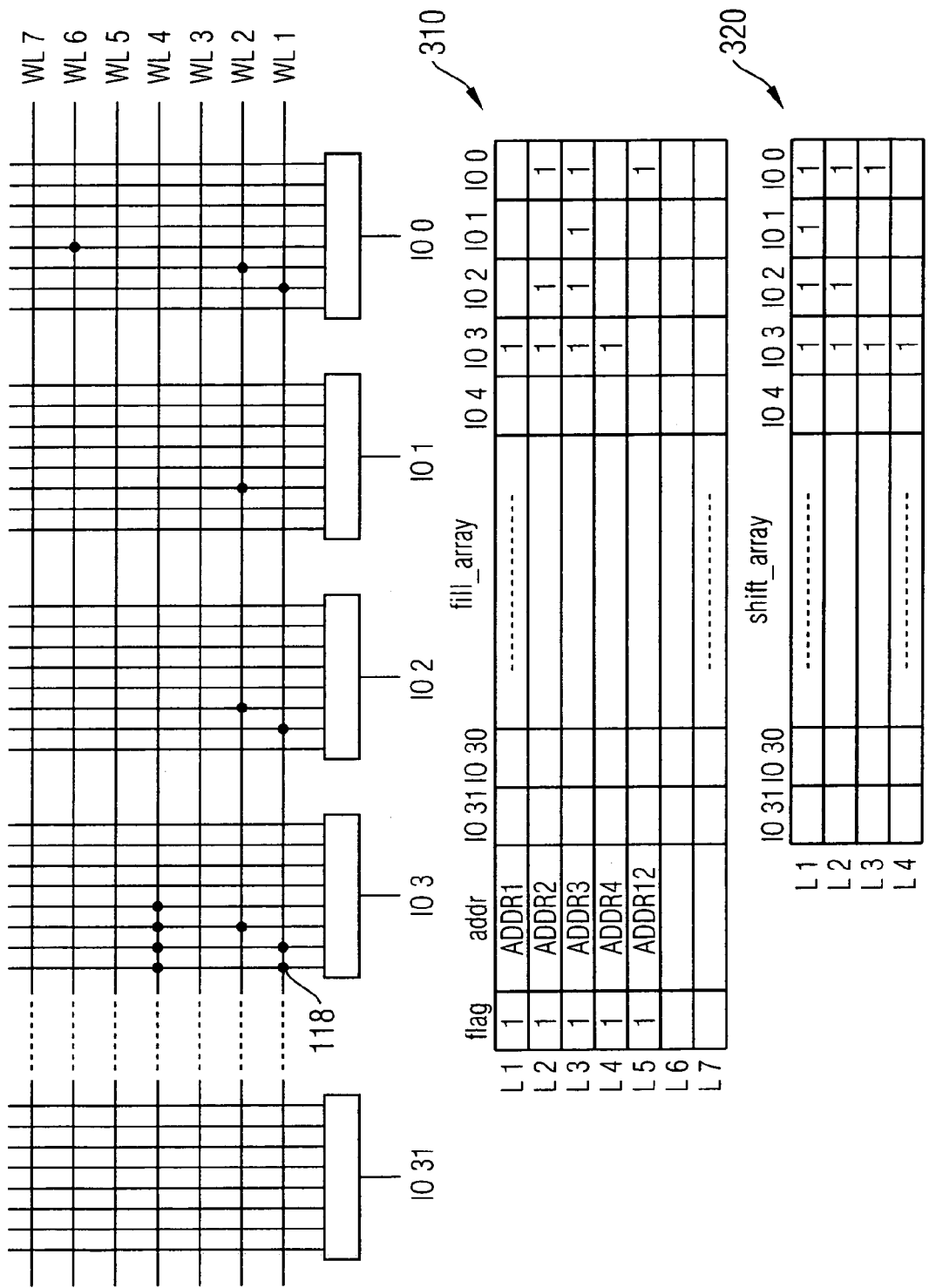

As illustrated in FIG. 8, a fifth defect on IO line 3 may be detected at a fifth address. However, because the shift array is already filled up in the column corresponding to IO line 3, no entry is made in the fill_array 310. In this manner, the shift_array 320 limits entries made to the fill_array 310. Similarly, when sixth, seventh, and ninth defects are detected on IO line 3, as illustrated in FIGS. 9, 10, and 12, respectively, the two arrays are not changed.

Figure 11:
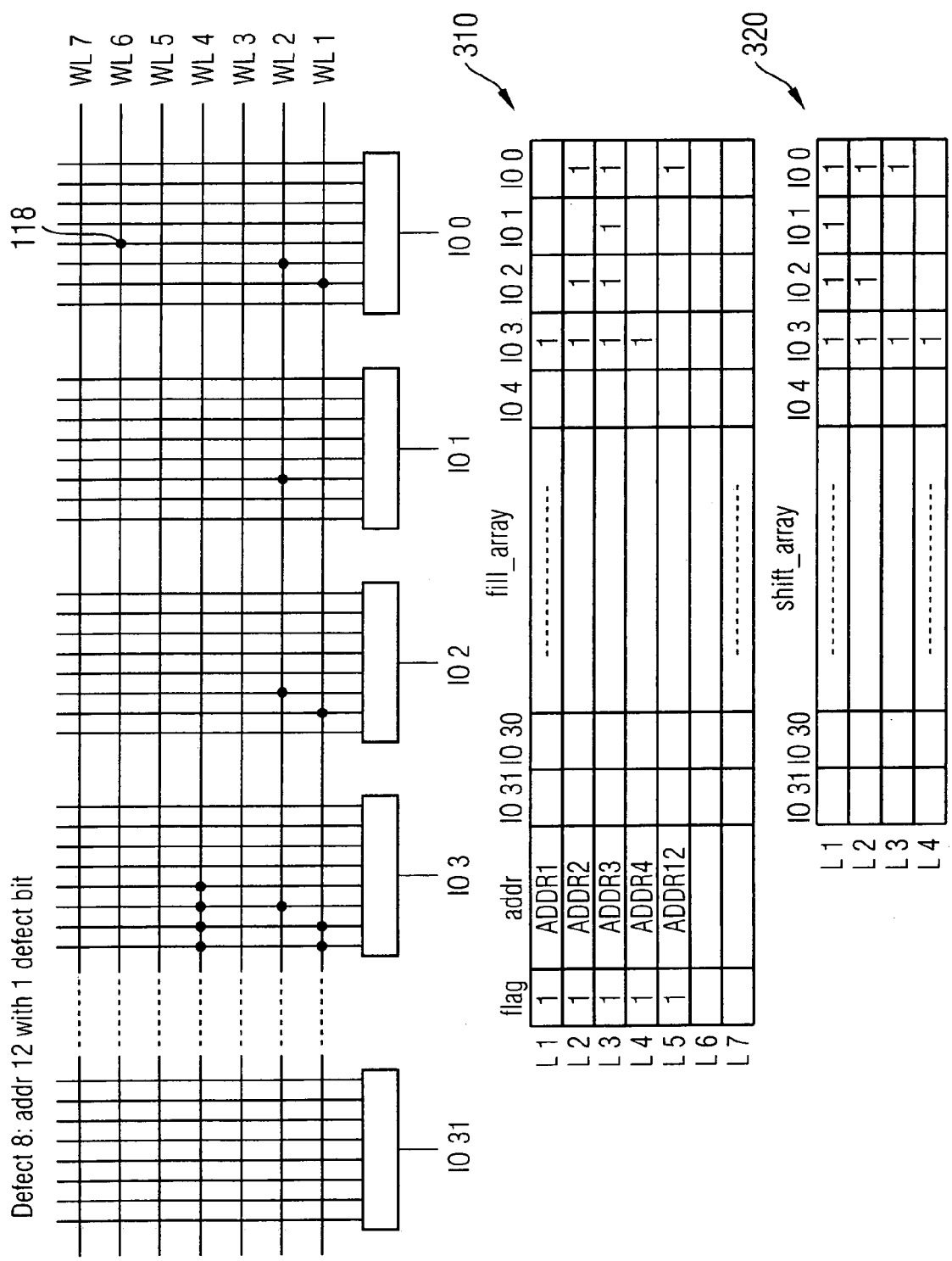

However, as illustrated in FIG. 11, when an eighth defect on IO line 0 is detected at a twelfth address, a flag bit for the fifth line in the fill_array 310 may be set, and the twelfth address may be stored in the address column. A bit may also be set in the column corresponding to IO line 0, indicating the location of the detected defect. In the shift_array 320, a bit in the next available column corresponding to IO line 0 may be set, line 3 in this example.

Figure 13:
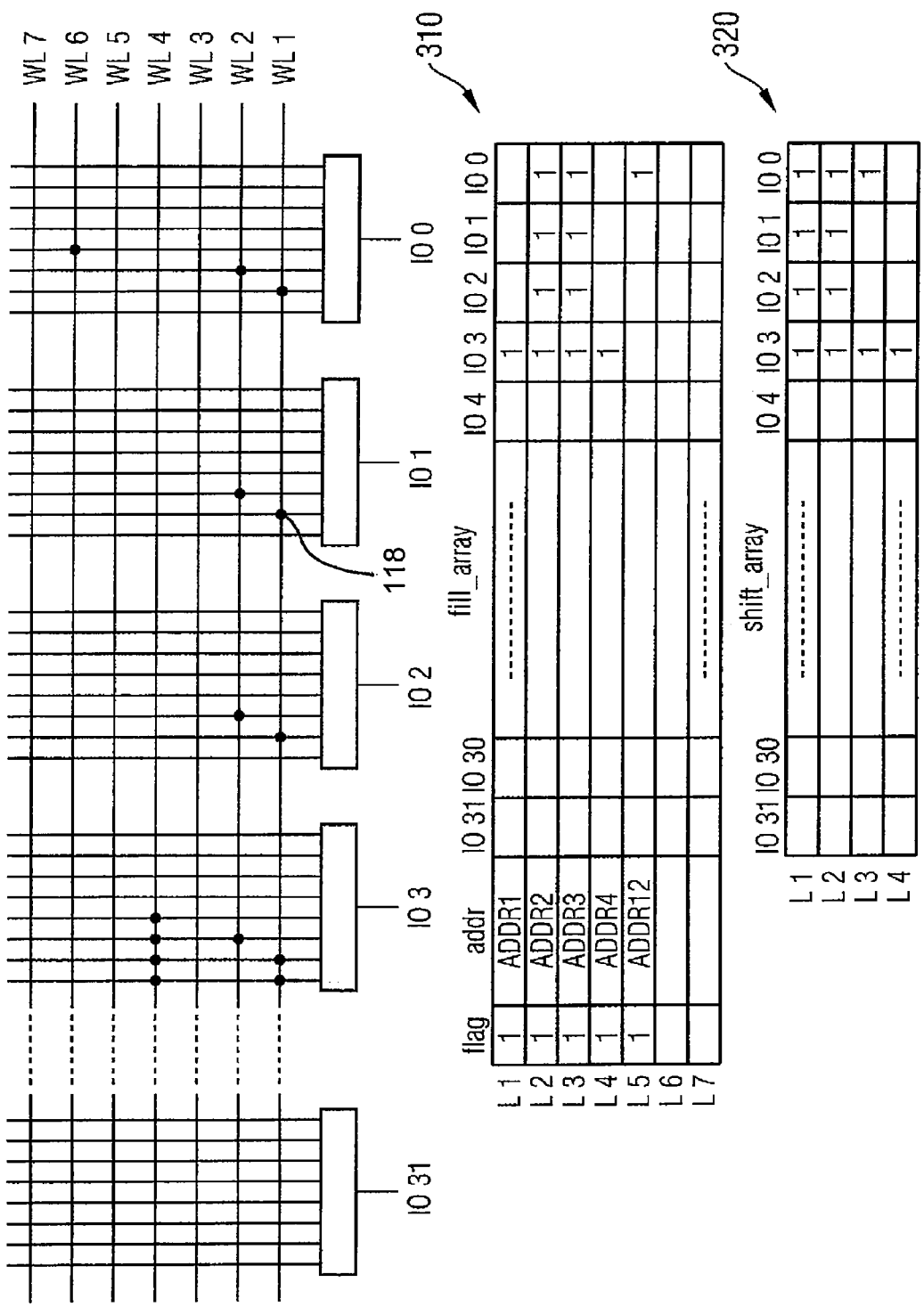

As illustrated in FIG. 13, a tenth defect on 10 line 1 may be detected at the second address. However, the second address is already stored in the fill_array 310. Therefore, the bit corresponding to IO line 1 may be set to indicate this newly detected defect. In the shift_array 320, a bit in the next available column corresponding to IO line 1 may be set, line 2 in this example.

It has to mentioned once again that according to the invention the defects are stored on chip during BIST and the diagnosis is carried out on chip, too, using said two arrays (fill_array 310 and shift_array 320).

Figure 14:
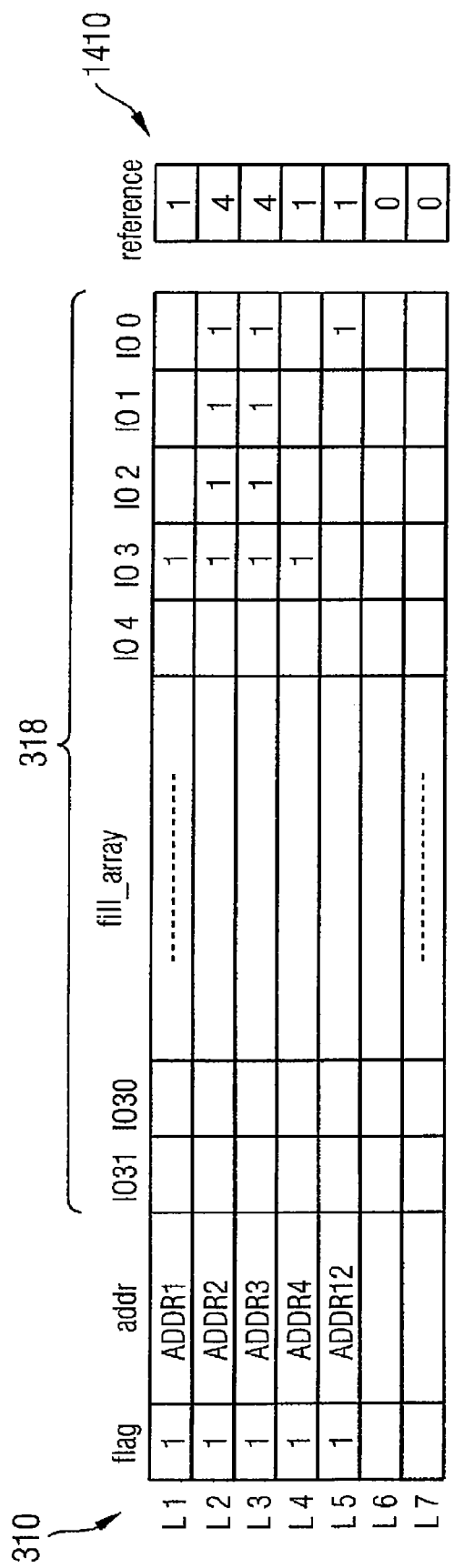
FIG. 14 shows how a reference element is built from the fill_array at the end of a BIST run.

At the end of the BIST run for the diagnostic there are built two elements from the fill_array. The first one is called "reference element" 1410, is shown in FIG. 14. The reference element 1410 indicates for each line of the fill_array 310, the number of faults for each address stored.

Figure 15:
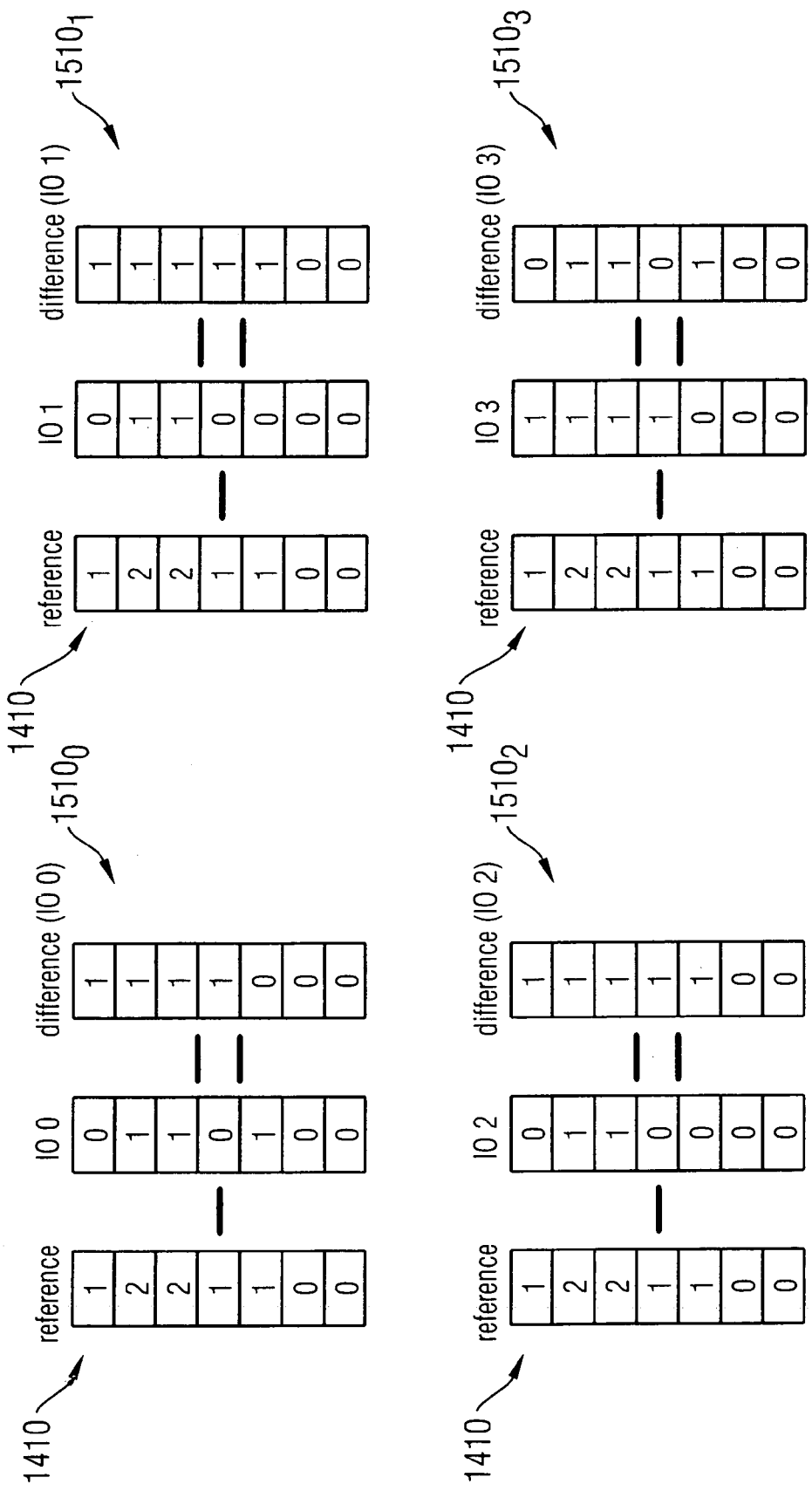
FIG. 15 shows how difference elements are built from the reference element and the fill_array.

The second element (called "difference element") computes for each IO the difference between the reference element 1410 and a column of the fill_array 310 corresponding to each IO line. For example, FIG. 15 illustrates difference elements $1510_0$-$1510_3$ generated for columns of the fill_array 310 corresponding to IO lines 0-3, respectively.

Figure 16:
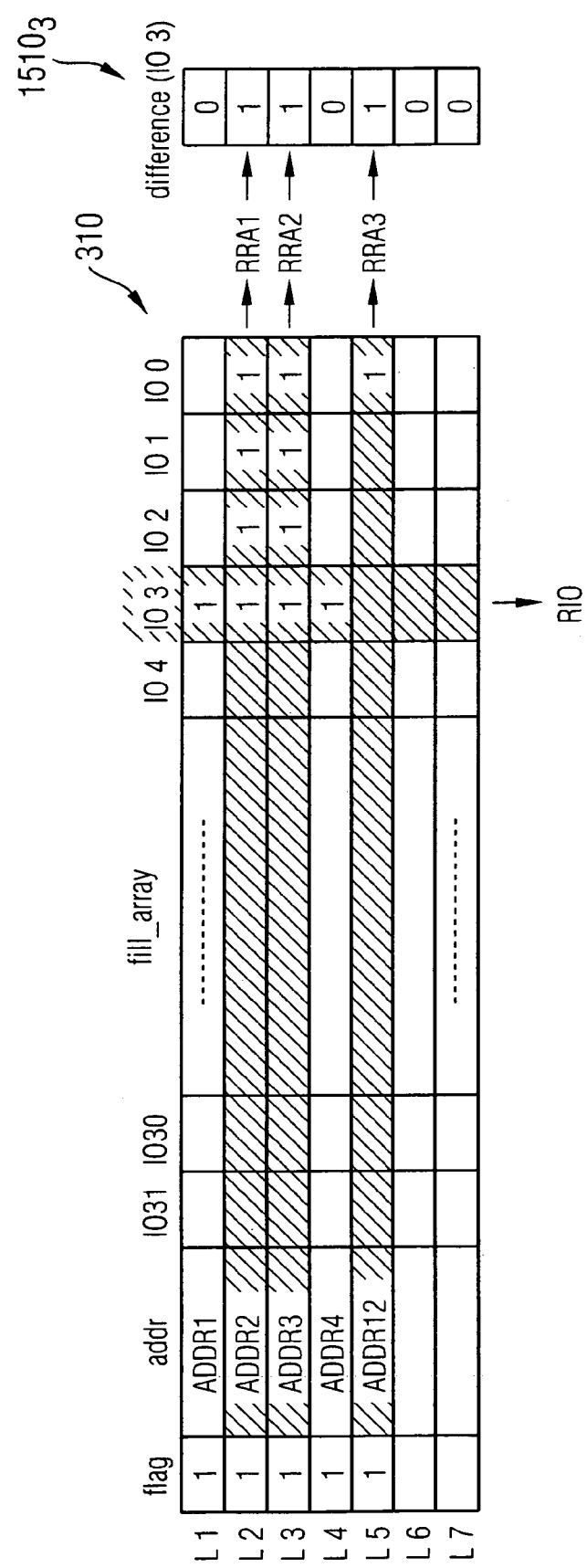
FIG. 16 shows how the redundant IO is fixed using the difference elements shown in FIG. 15.

To optimize the efficiency of the redundant IO, it is determined which difference element that has the maximum number of "0" entries. In the present example, difference element $1510_3$(IO 3) contains the maximum number of zero entries (=4). The memory of FIG. 1, with defects shown in FIG. 2 can now be repaired by replacing IO line 3 with the redundant IO (IOR 116), as shown in FIG. 16. The difference element $1510_3$ indicates which addresses have to be stored inside redundant address registers 122 (inside this element it is indicated by all bits set to "1"). In other words, external redundancy can be activated by setting the external redundant address registers such that: RRA1 =ADDR2, RRA2 =ADDR3, and RRA3 =ADDR12.

FIG. 17 shows a flow chart of the exemplary operations 1700 of a test repair sequence in accordance with one embodiment of the present invention. At step 1702, a BIST is started and performed, at step 1704. If the BIST test is done, as determined at step 1706, the diagnostic operations described herein are performed, at step 1708. If no faults are detected, as determined at step 1710, the test sequence terminates, at step 1712. If faults are detectable, unrepairable memory locations are flagged, at step 1716. Redundancy is activated, at step 1718, to fix repairable memory locations. The test sequence is terminated, at step 1720.

What is claimed is:

1. A diagnosis method performed on a memory device for repair of the memory device, the memory device containing a plurality of memory cells, comprising:
   during a built-in self test (BIST), storing inside two arrays on the memory device information for use in a final diagnosis to apply redundancy resources to repair the memory device, wherein a first array is used to store addresses of memory words, where the addresses correspond to one or more detected defect memory cells and for each stored address of a memory word, further storing input/output line locations of the detected defect memory cells, and a second array with a plurality of entries is used to store the input/output line locations and control what information is stored in the first array, wherein a number of entries is determined based on an amount of available redundant resources; and
   activating redundancy resources based upon analysis of the information stored in the first array by generating a reference element from information stored in the first array, wherein the reference element indicates whether there are one or more of the detected defect memory cells associated with each address stored in the first array;
   generating difference elements based on information stored in the reference elements and information stored in the first array, wherein each difference element indicates a difference between said reference element and a column in the first array corresponding to an input/output line of the memory device; and
   selecting a difference element with a maximum number of zero value entries to indicate which addresses have to be stored inside redundant registers external to the memory device.

2. The method of claim 1, further comprising replacing an input/output line of the memory device corresponding to the selected difference element with a redundant input/output line.

3. The method of claim 1, further comprising storing, inside the redundant registers, addresses stored in the first array.

4. The method of claim 3, comprising storing, inside the redundant registers, addresses in the first array corresponding to non-zero entries in the selected difference element.

5. The method of claim 1, wherein the addresses of the memory words stored in the first array are word addresses.

6. The method of claim 1, wherein the activated redundancy resources comprise redundant input/output lines and redundant word registers.

7. A diagnosis circuit for use in repair of a memory device containing the diagnosis circuit, the memory device containing a plurality of memory cells, comprising:
   a first array for storing addresses of memory words, where the addresses correspond to one or more detected defect memory cells detected during a built in self test (BIST) and, for each stored address of a memory word, further storing corresponding input/output line locations of the detected defect memory cells;
   a second array with a plurality of entries for storing the corresponding input/output line locations and for controlling entry of information in the first array during the BIST, wherein a number of entries is determined by an amount of available redundant resources; and
   repair circuitry for activating redundancy resources to repair the memory device based upon analysis of information stored in the first array, wherein the repair circuitry is configured to, at the end of the BIST:
   generate a reference element from information stored in the first array, wherein the reference element indicates whether there are one or more of the detected defect memory cells associated with each address stored in the first array;
   generate difference elements based on information stored in the reference elements and information stored in the first array, wherein each difference element indicates a difference between said reference element and a column in the first array corresponding to an input/output line of the memory device; and
   select a difference element with a maximum number of zero value entries to indicate which addresses have to be stored inside redundant registers external to the memory device.

8. The diagnosis circuit of claim 7, wherein:
   the first array comprises a number of rows and columns, wherein the columns include a column for storing the addresses of the memory words which comprise one or more detected defect memory cells and columns for indicating, for each stored address, the input/output lines associated with the detected defect memory cells.

9. The diagnosis circuit of claim 8, wherein the number of rows of the first array is determined by a number of redundant registers and number of redundant input/output lines available.

10. The diagnosis circuit of claim 7, wherein the second array comprises a number of rows and columns, wherein the columns include columns for indicating input/output lines associated with the detected defect memory cells and the number of rows is less than the number of rows in the first array.

11. The diagnosis circuit of claim 10, wherein the number of rows of the second array is determined by a number of redundant registers available.

12. The diagnosis circuit of claim 7 wherein the repair circuitry is further configured to replace an input/output line of the memory device corresponding to the selected difference element with a redundant input/output line.

13. The diagnosis circuit of claim 12, wherein the repair circuitry is further configured to store, inside the redundant registers, addresses stored in the first array.

14. The diagnosis circuit of claim 13, wherein the repair circuitry is further configured to store, inside the redundant registers, addresses in the first array corresponding to non-zero entries in the selected difference element.

15. The diagnosis circuit of claim 6 wherein the addresses of the memory words stored in the first array are word addresses.

16. The diagnosis circuit of claim 6 wherein the activated redundancy resources comprise redundant input/output lines and redundant word registers.

17. A memory device, comprising:
an array of memory cells accessible via word lines and input/output lines;
one or more redundant input/output lines; and
a diagnosis circuit for use in repairing defective memory cells in the array, wherein the diagnosis circuit comprises,
  a first array for storing addresses of memory words, where the addresses correspond to one or more detected defect memory cells detected during a built in self test (BIST) and, for each stored address of a memory word, further storing corresponding input/output line locations of the detected defect memory cells contained in the memory word;
  a second array with a plurality of entries for use in storing the corresponding input/output line locations and controlling entry of information in the first array during the BIST, and a number of entries is determined by a number of available redundant resources; and
  repair circuitry for activating redundancy resources to repair the memory device based upon analysis of information stored in the first array, wherein the repair circuitry is configured to, at the end of the BIST:
  generate a reference element from information stored in the first array, wherein the reference element indicates whether there are one or more detected defect memory cells associated with each address stored in the first array;
  generate difference elements based on information stored in the reference elements and information stored in the first array, wherein each difference element indicates a difference between said reference element and a column in the first array corresponding to an input/output line of the memory device; and
  select a difference element with a maximum number of zero value entries to indicate which addresses have to be stored inside redundant registers external to the memory device.

18. The memory device of claim 17, wherein:
the first array comprises a number of rows and columns, wherein the columns include a column for storing the addresses of memory words which comprise one or more detected defect memory cells and columns for indicating, for each stored address, the input/output lines associated with the detected defect memory cells.

19. The memory device of claim 18, wherein the number of rows of the first array is determined by a number of redundant registers and the number of the one or more redundant input/output lines.

20. The memory device of claim 17, wherein the second array comprises a number of rows and columns, wherein the columns include columns for indicating input/output lines associated with the detected defect memory cells and the number of rows is less than the number of rows in the first array.

21. The memory device of claim 20, wherein the number of rows of the second array is determined by a number of redundant registers available.

22. The memory device of claim 17, wherein the repair circuitry is further configured to replace an input/output line of the memory device corresponding to the selected difference element with a redundant input/output line.

23. The memory device of claim 22, wherein the repair circuitry is further configured to store, inside the redundant registers, addresses stored in the first array.

24. The memory device of claim 23, wherein the repair circuitry is further configured to store, inside the redundant registers, addresses in the first array corresponding to non-zero entries in the selected difference element.

25. The memory device of claim 17, wherein the memory device is a dynamic random access memory (DRAM) device.

26. The memory device of claim 17, wherein the addresses of the memory words stored in the first array are word addresses.

27. The memory device of claim 17, wherein the activated redundancy resources comprise redundant input/output lines and redundant word registers.

* * * * *

UNITED STATES PATENT AND TRADEMARK OFFICE
CERTIFICATE OF CORRECTION

PATENT NO. : 7,386,769 B2  
APPLICATION NO. : 10/942274  
DATED : June 10, 2008  
INVENTOR(S) : Jallamion-Grive et al.

Page 1 of 1

It is certified that error appears in the above-identified patent and that said Letters Patent is hereby corrected as shown below:

Column 4, Line 37, please delete "10" and insert therefor --IO--;

Column 6, Line 62, in Claim 15, please delete "claim 6" and insert therefor --claim 7--;

Column 6, Line 65, in Claim 16, please delete "claim 6" and insert therefor --claim 7--.

Signed and Sealed this

Fifth Day of May, 2009

JOHN DOLL  
*Acting Director of the United States Patent and Trademark Office*